United States Patent
Bae et al.

(10) Patent No.: US 7,821,513 B2
(45) Date of Patent: Oct. 26, 2010

(54) SYSTEM AND METHOD FOR ANALYZING MODELING ACCURACY WHILE PERFORMING REVERSE ENGINEERING WITH 3D SCAN DATA

(75) Inventors: Seockhoon Bae, Cupertino, CA (US); Donghoon Lee, Seoul (KR)

(73) Assignee: INUS Technology, Inc., Seoul (KR)

( * ) Notice: Subject to any disclaimer, the term of this patent is extended or adjusted under 35 U.S.C. 154(b) by 750 days.

(21) Appl. No.: 11/733,029

(22) Filed: Apr. 9, 2007

(65) Prior Publication Data
US 2008/0036755 A1   Feb. 14, 2008

Related U.S. Application Data

(60) Provisional application No. 60/767,517, filed on May 9, 2006.

(51) Int. Cl.
    *G06T 15/00* (2006.01)
(52) U.S. Cl. .................. 345/418; 345/419; 345/423; 382/128; 356/601; 33/554
(58) Field of Classification Search ............ 345/418, 345/419, 423; 382/128; 356/601; 33/554
    See application file for complete search history.

(56) References Cited

U.S. PATENT DOCUMENTS

| | | | | |
|---|---|---|---|---|
| 6,032,377 | A * | 3/2000 | Ichikawa et al. | 33/554 |
| 6,532,299 | B1 * | 3/2003 | Sachdeva et al. | 382/128 |
| 6,542,249 | B1 * | 4/2003 | Kofman et al. | 356/601 |
| 6,545,676 | B1 * | 4/2003 | Ryan et al. | 345/423 |
| 7,068,825 | B2 * | 6/2006 | Rubbert et al. | 382/128 |
| 2005/0134586 | A1 | 6/2005 | Koo et al. | |

OTHER PUBLICATIONS

"The Error Analysis of Product Reverse Engineering," *Machinery Design & Manufacture*, vol. 6:66-68 (2000).
Liyan, Zhang et al., "Error Analysis and Visualization of Reconstructed Triangle Mesh Survace," *Journal of Nanjing University of Aeronautics & Astronautics*, vol. 33(3):282-285 (2001).
Wei, Zhang et al., "The Error Analysis and Quality Control of Reverse Engineering," *Mechanical & Electrical Engineering Magazine*, vol. 18(1):14-16 (2001).
Jang, Soo-Pyeong, "Three-dimension Reconstruction of Complicated Surface Based on Point Cloud Data," Master's Thesis abstract published by Xin Jiang University (2004).

* cited by examiner

*Primary Examiner*—Phu Nguyen
(74) *Attorney, Agent, or Firm*—Lahive & Cockfield, LLP; John S. Curran

(57) ABSTRACT

An automated mechanism for measuring the amount of accuracy loss attributable to reverse engineering processes that use 3D scan data is discussed. The embodiments provide a mechanism that displays to a user the effect scan data editing and CAD remodeling operations have on scan data accuracy. Additionally, the user can choose the way the graphical display illustrates the error distribution on the model such as by color mapping and whisker mapping. The accuracy loss may be displayed to the user after finishing an editing/modeling command or during the previewing of the command thereby allowing a user to take appropriate action. Parameters may also be adjusted programmatically based on the amount of accuracy loss determined to be attributable to scan data editing or CAD remodeling operations.

43 Claims, 18 Drawing Sheets

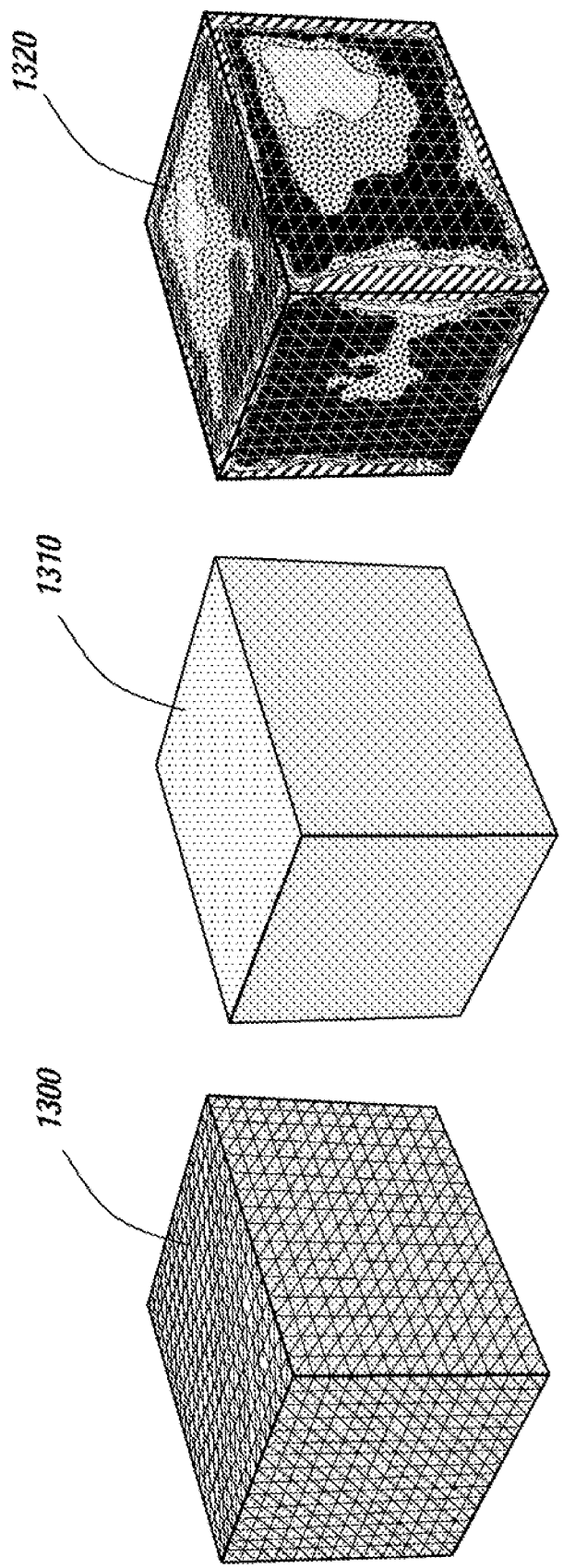

SYSTEM AND METHOD FOR ANALYZING MODELING ACCURACY WHILE PERFORMING REVERSE ENGINEERING WITH 3D SCAN DATA

RELATED APPLICATION

This application claims the benefit of a U.S. Provisional Application entitled, "System and Method for Analyzing Modeling Accuracy While Performing Reverse Engineering With 3D scan data", Application No. 60/767,517, filed May 9, 2006.

FIELD OF THE INVENTION

The embodiments of the present invention relate generally to CAD (Computer Aided Design) and more particularly to the measurement of accuracy loss during reverse engineering processes.

BACKGROUND

Computer Aided Design (CAD) applications are used to produce computer models of two and three dimensional objects as part of the production process for the actual physical device being modeled. The models frequently include multiple CAD part bodies which must be individually designed. A CAD part body is a computational model used by a CAD application to hold a solid or a sheet (open body with zero thickness) geometry. Once the designer is satisfied with the design, the actual physical device may be produced using the CAD model.

3D scanning captures physical geometry information for a three-dimensional object by gathering high resolution points representing the shape of the scanned three-dimensional object. The 3D scan data can be represented by either a set of points or dense triangular (or other shaped) meshes which cumulatively form a model of the scanned object. The model can be segmented into multiple groups referred to as regions. In a mesh model, the region is a mesh region that is a set of triangular (or other shaped) facets which can be arbitrarily defined by the user or can be automatically identified by a computer program. The computer program can also be designed to detect and group planar, cylindrical, spherical, conical, toroidal, or freeform mesh regions by estimating and tracing the curvature information. Once captured, the raw 3D scan data may be converted to a CAD part model for further processing to replicate or modify the design of the three-dimensional object. This procedure of capturing 3D scan data for a three-dimensional object in order to provide it to a CAD application so that the object may be replicated or redesigned is referred as reverse engineering.

During the reverse engineering process there are two major possibilities of losing the original scan data accuracy. The first possibility can happen during the editing processes for the raw 3D scan data 3D scan data is prone to be noisy so that the user needs to perform smoothing operations on the data to make it easier to directly calculate NC tool paths, build a RP (Rapid Prototyping) model or remodel a CAD part. However, a smoothing operation moves points in the scan data with the result that there occurs an accuracy loss compared to the original data. Another type of operation which leads to the loss of accuracy is decimation (or simplification). Decimation is a process to reduce the number of mesh facets by using bigger meshes when representing more planar (flat) regions. Decimation also modifies point coordinates from the original scan data.

The second part of the reverse engineering process where there is a substantial danger of losing the original scan data accuracy is during the designing of a CAD model replicating the raw 3D scan data geometry. A CAD part body is represented by a set of parametric surfaces whereas 3D scan data is represented by points or a set of triangular (quadric or other shaped) meshes. As a result there is always a disparity between the raw 3D scan model and the reverse engineered CAD model. The loss of accuracy can be interpreted as the deviation between the two models. Ideally, the user should be able to track and manage the accuracy loss throughout the whole reverse engineering processes from raw scan data editing to CAD remodeling. Unfortunately, the tracking and managing of the accuracy loss is not an easy task since the user is required to check the accuracy loss whenever the user edits the raw scan data and/or adds CAD features.

BRIEF SUMMARY

The embodiments of the present invention provide the user with an automated and efficient way to measure the amount of accuracy loss attributable to reverse engineering processes that use 3D scan data. The embodiments provide a mechanism that continually updates the user on the effect ongoing reverse engineering procedures have on scan data accuracy. The present invention opens raw 3D scan data so that the user can start scan data editing or CAD remodeling. The user can set a parameter that controls the total allowance, the amount of allowable error. The allowance indicates the maximum distance deviation between the original raw scan data and the final reverse engineered CAD model or the edited scan data. Also, the user can choose the way the graphical display illustrates the error distribution on the model such as by color mapping, and whisker mapping. The present invention automatically updates the accuracy loss information available to a user by illustrating the loss on the user-specified error display on the model. The error may be displayed to the user after finishing an editing/modeling command or during the previewing of the command. An accuracy analyzer facility automatically displays the region where the accuracy loss exceeds the total allowance in a user specified color. The error display graphically notifies the user of undesirable editing or modeling parameters.

In one embodiment of the present invention a method for analyzing 3D modeling accuracy when processing 3D scan data includes the step of providing a collection of 3D scan data forming a model that represents the shape of a three dimensional object. A CAD system being used to remodel at least one CAD part body formed from the 3D scan data is also provided. The method selects an operation designed to manipulate either at least a portion of the 3D scan data or at least a portion of the CAD part body. The method also determines a measure of loss of accuracy that is attributable to the selected operation. The measured loss of accuracy that is attributable to the selected operation is presented to a user.

In another embodiment, a system for analyzing 3D modeling accuracy when processing 3D scan data includes a collection of 3D scan data forming a model that represents the shape of a three dimensional object. The system also includes a CAD application being used to remodel at least one CAD part body formed from the 3D scan data. Additionally, a user interface enables the selection of an operation. The selectable operation is either a scan data editing operation or a CAD remodeling operation. The system also includes an accuracy analysis facility that measures a loss of accuracy attributable to the selected operation.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

FIGS. 13A-13C depict the display of accuracy information for a CAD solid created from scan data;

DETAILED DESCRIPTION

The embodiments of the present invention provides accuracy loss information to a user performing reverse engineering using 3D scan data. The accuracy loss information indicates the effect of scan data editing operations or CAD remodeling operations on 3D scan data. Accuracy loss indicates the distance deviation between a chosen reference 3D scan data (e.g.: the original scan data or the previous state of the 3D scan data prior to modification) and the modified raw 3D scan data or a derivative of the 3D scan data such as a surface or solid body. Changes to the reference scanned data that have been or will be caused by a scan data editing or CAD remodeling operation are noted for a user. In one implementation, the effect of a proposed operation is presented to the user in a preview pane before the operation is completed.

Figure 1:
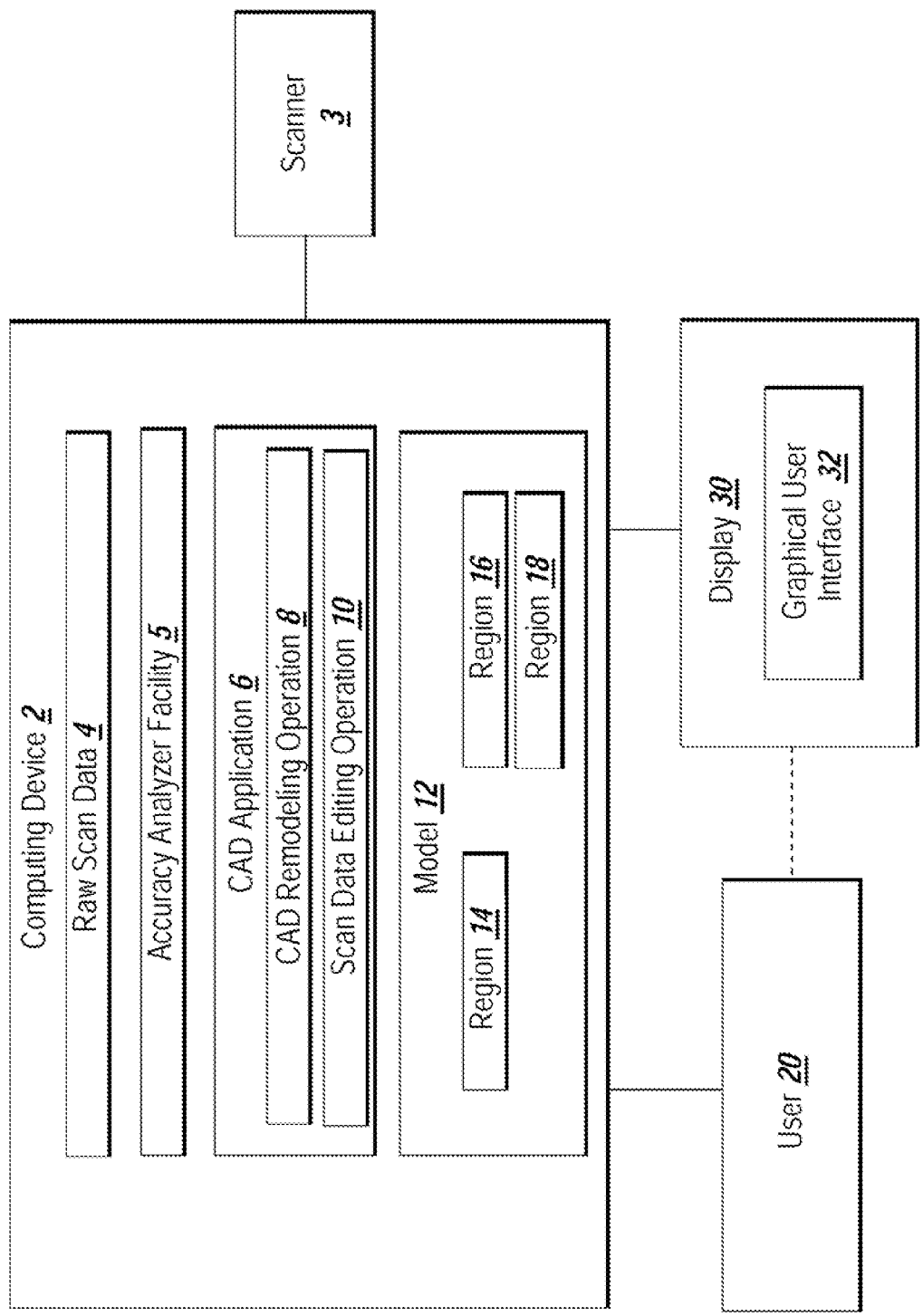
FIG. 1 depicts an environment suitable for practicing an embodiment of the present invention.

FIG. 1 depicts an environment suitable for practicing an embodiment of the present invention. A computing device 2 includes a collection of raw 3D scan data 4 for a scanned three-dimensional object. The raw 3D scan data 4 may be collected from a three-dimensional scanner 3 in communication with the computing device 2 or may be a stored collection of scan data. The computing device 2 also hosts an accuracy analyzer facility 5 and CAD application 6. The computing device 2 may be a workstation, server, laptop, mainframe, PDA, a cluster of devices operating together, a virtual device or another computing device able to support the accuracy analyzer facility 5 and CAD Application 6 discussed herein. The accuracy analyzer facility 5 is implemented in software and identifies the amount of accuracy loss attributable to a selected operation performed using 3D scan data. The accuracy analyzer facility 5 may be implemented as one or more processes, threads, tasks, application plug-ins, stand-alone applications or other executable processes. In one implementation of the present invention, the accuracy analyzer facility 5 is integrated into the CAD application 6 as a tool. In another implementation, the accuracy analyzer facility 5 is in communication with the CAD application 6 but is not part of the CAD application. The CAD application 6 may include or have access to at least one CAD remodeling operation 8 and at least one scan data editing application 10. The CAD remodeling operation 8 and scan data editing operation 10 are discussed in further detail below.

The raw scan data 4 is a collection of high resolution points in three dimensions representing the shape of a scanned three dimensional object. In one implementation, the raw scan data 4 is a set of triangular meshes but the use of other forms of scan data is also considered to be within the scope of the present invention. For example, the raw scan data 4 may be points, triangular meshes, quad meshes, tetrahedral meshes or hexahedral meshes. Collectively the set of meshes form a mesh model representing the surface of the scanned three dimensional object. Alternatively, the raw scan data may be formed into a point cloud model representing the surface of the scanned three dimensional object. The model 12 may have one or more regions 14, 16 and 18. The accuracy analyzer facility 5 generates a GUI 32 on a display 30 that enables a user 20 to track different types of accuracy metrics attributable to the performance of a CAD remodeling operation 8 or scan data editing operation 10. The accuracy analyzer facility 5 compares the original raw scan data 4 to the values resulting from the operations as set forth further below and identifies the amount of change attributable to the performance of the operations. The calculated loss of accuracy versus the values of the original scan data is displayed to the user. The user may enter additional commands via the GUI 32 or another mechanism based on the information displayed.

Figure 2:
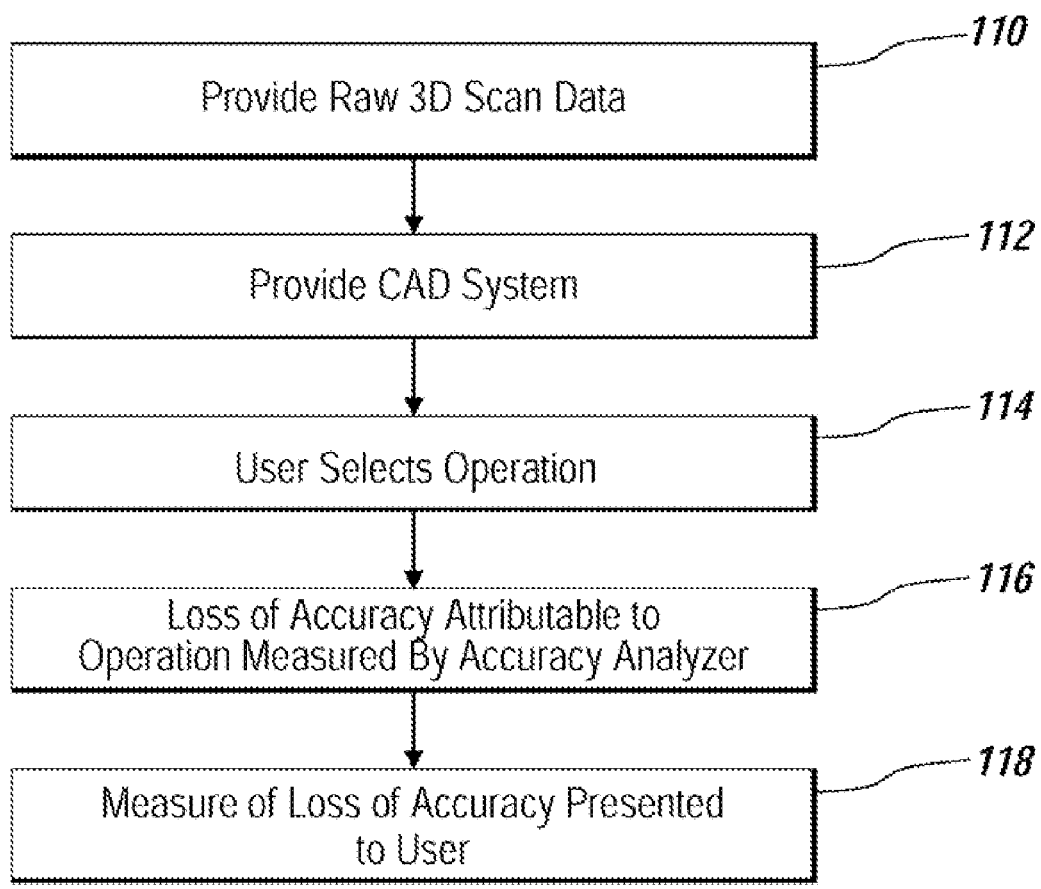
FIG. 2 is a flowchart of a sequence of steps followed by an embodiment of the present invention to measure accuracy loss in 3D scan data.

FIG. 2 is a flowchart of a sequence of steps followed by an embodiment of the present invention to measure accuracy loss in 3D scan data associated with CAD remodeling or scan data editing operations. The sequence of steps begins with the provision of a collection of raw 3D scan data 4 that forms a model 12 representing a three dimensional object (step 110). The raw 3D scan data 4 may be gathered immediately prior to performing a CAD remodeling operation 8 or scan data editing operation 10. Alternatively, the raw 3D scan data may be previously stored scan data. The accuracy analyzer facility 5 stores the original 3D scan data in the computer memory space (or caches the data in a temporary file). A CAD application 6 that is used to remodel at least one CAD part body formed from the 3D scan data is also provided (step 112). A user selects an operation designed to manipulate either a portion of the 3D scan data or a portion of the CAD part body (step 114). The operation may be a CAD remodeling operation 8 or scan data editing operation 10. A GUI 32 is provided which allows the user 20 to specify the total allowance value (amount of allowable error), the type of error, and the error display method which controls how the user is informed about the error. The accuracy analyzer facility 5 measures the loss of accuracy attributable to the selected operation (step 116). The accuracy analyzer facility 5 then graphically presents the measure of loss of accuracy to the user (step 118). The results may be provided to a user in a preview pane in the graphical user interface prior to the operation being executed. Alternatively, the accuracy loss results may be presented to a user via the graphical user interlace after the completion of the operation. The accuracy analyzer facility 5 may then receive a confirmation from the user of a desired course of action such as continuing with the operation, adjusting the operation or abandoning the operation. The means of presenting the measure of the accuracy loss and options available to a user to respond to the display of the measure of accuracy loss are discussed further below.

In one embodiment the accuracy analyzer facility 5 allows a user to track accuracy loss caused by the performance of scan data editing operations on scan data. When the user runs commands that may move the original point coordinates, the accuracy analyzer facility 5 analyzes the operation. The GUI 32 may include a command dialog window in which a graphical preview command allows the user to preview the expected result of the command prior to command execution. When previewing the result, the user also can preview accuracy loss attributable to the performance of the command. The accuracy loss may be illustrated by error maps and users can adjust parameters to minimize the accuracy loss. In one embodiment the accuracy analyzer facility 5 automatically adjusts the parameters. The error maps may come in many forms and may include "heat maps" or other color maps where a color spectrum is used to represent different values in the results.

Figure 3A:
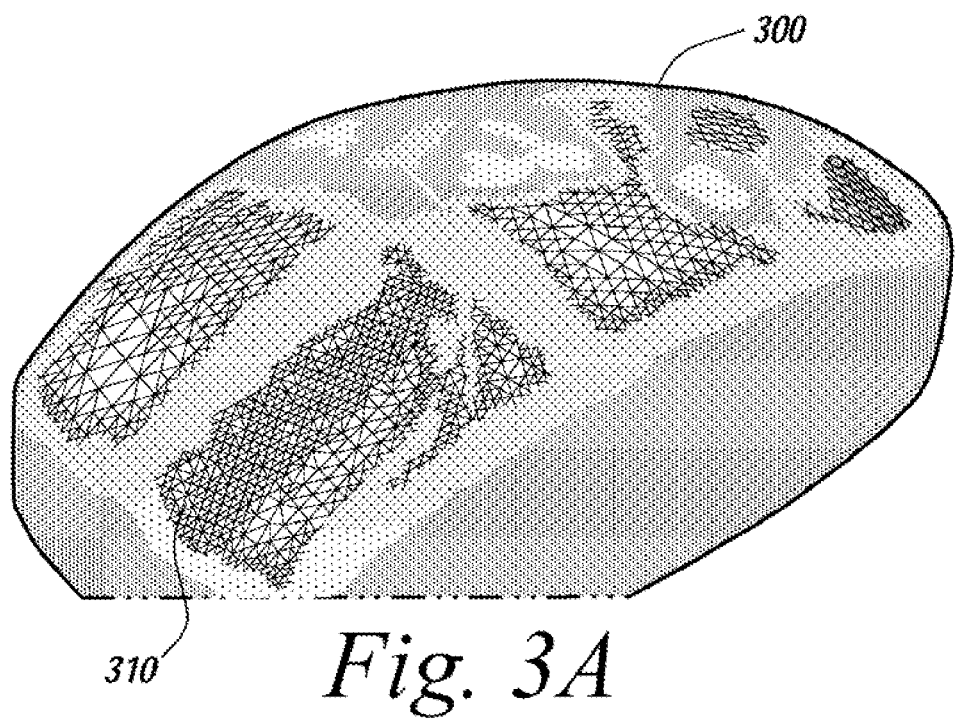
FIG. 3A depicts original scan data.
Figure 3B:
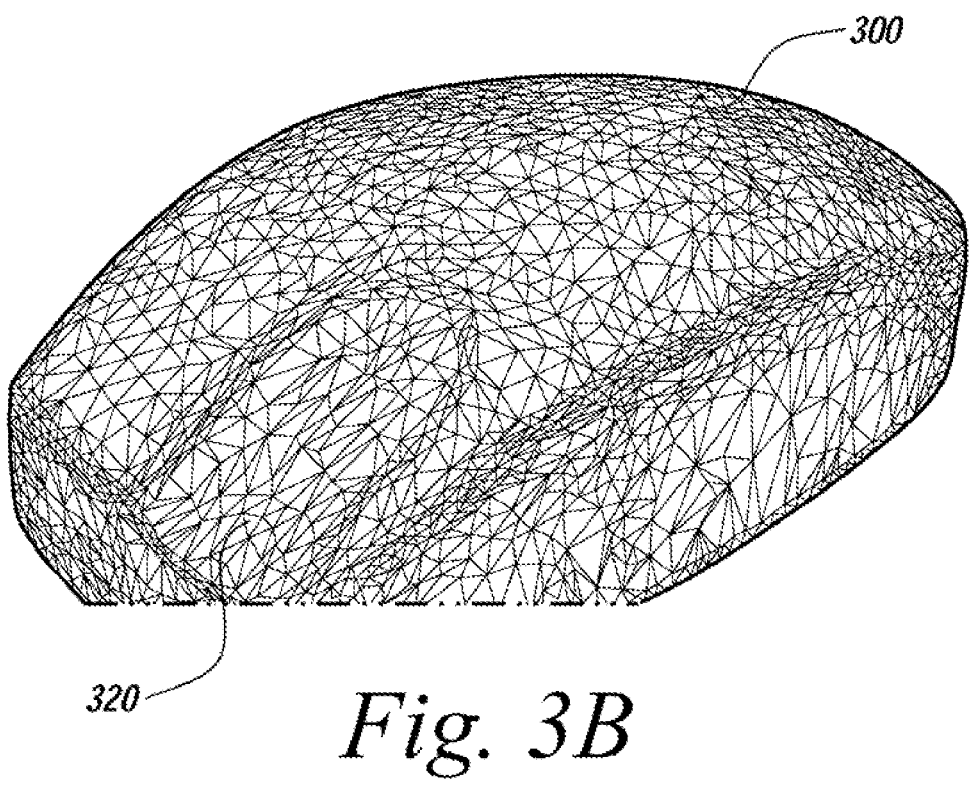
FIG. 3B depicts the scan data of FIG. 3A after decimation.
Figure 3C:
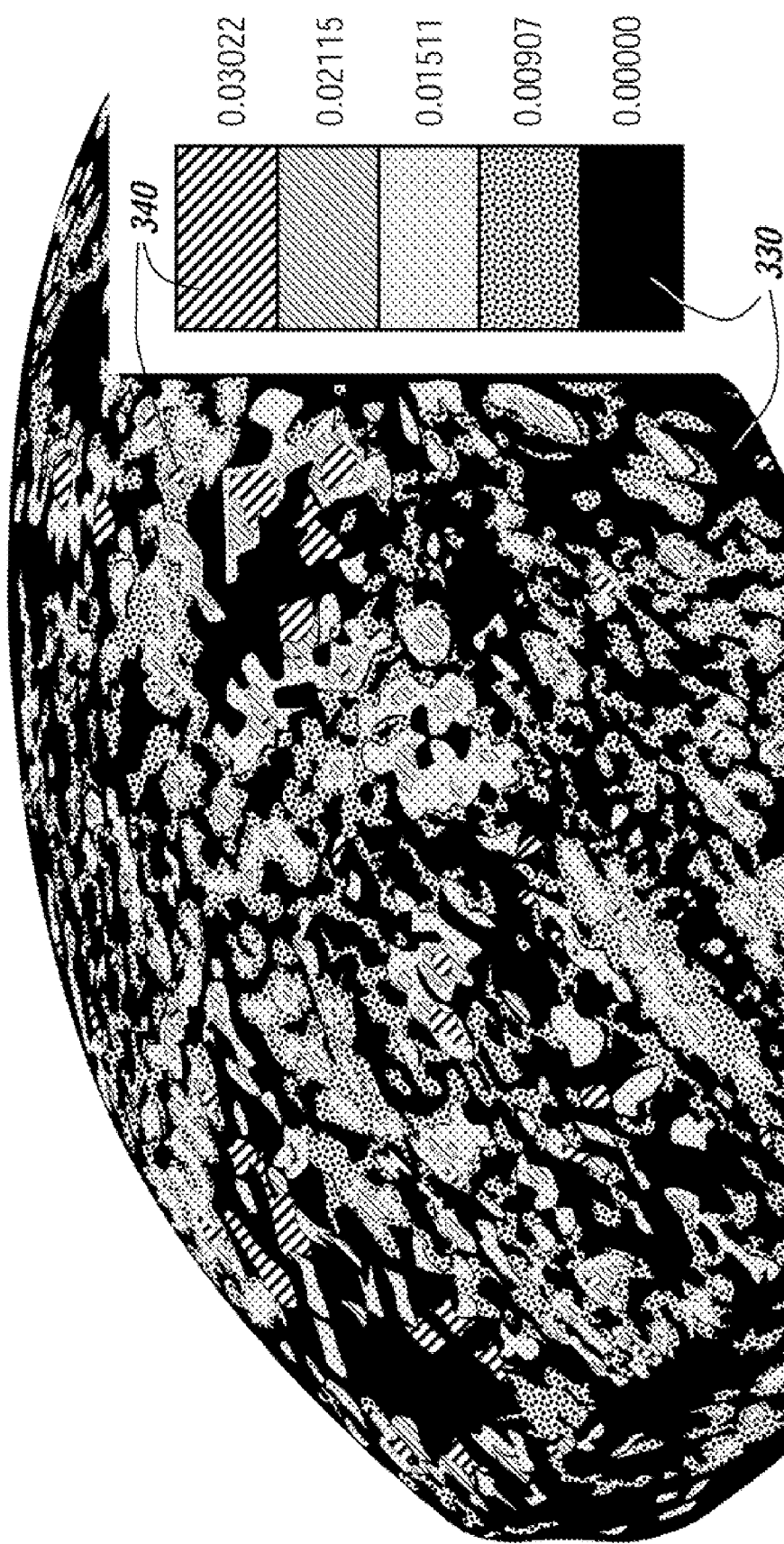
FIG. 3C depicts a display of the deviation calculation determined by the accuracy analyzer facility.

FIGS. 3A-3C depict the use of the accuracy analyzer facility 5. FIG. 3A depicts original scan data formed into a point cloud model 300 representing a three dimensional object, a computer mouse. The point cloud model 300 includes many small polygons (triangles in the depicted example) 310. FIG. 3B depicts the scan data after the point cloud model 300 has been modified by performing a decimation/simplification operation which combines many small polygons (triangles in the depicted example) into fewer larger polygons (triangles in the depicted example) 320. FIG. 3C shows a deviation analysis provided by the accuracy analyzer facility 5. The deviation analysis is provided to a user as an error map which shows the change between the original/starting scan data depicted in FIG. 3A and the point cloud after modification depicted in FIG. 3B. The error map may include a guide 335 that provides an index to the amount of deviation or other loss of accuracy determined for the different areas of the model. For example, in FIG. 3C, the amount of displayed deviation runs from 0.00 to 0.03022 mm. In FIG. 3C, the error map shows the accuracy loss values by altering the displayed pattern for different regions of the model from solid black 330 which represents no loss of accuracy to diagonal hatching 340 representing the most deviation (a deviation of at least 0.03022). It will be appreciated that the error map could also convey information using colors and color spectrums instead of using different patterns.

Deviation may be calculated using various methods. The simplest method works from the reference mesh/model and per polygon, finds the closest Polygon Center, Edge or Vertex of the other mesh/model. This distance result represents the deviation. A more complicated approach works on a per polygon basis where the normal direction of the polygon is determined and a search in this direction for the nearest polygon in the other mesh/model is conducted with the distance result representing the deviation.

Figure 4A:
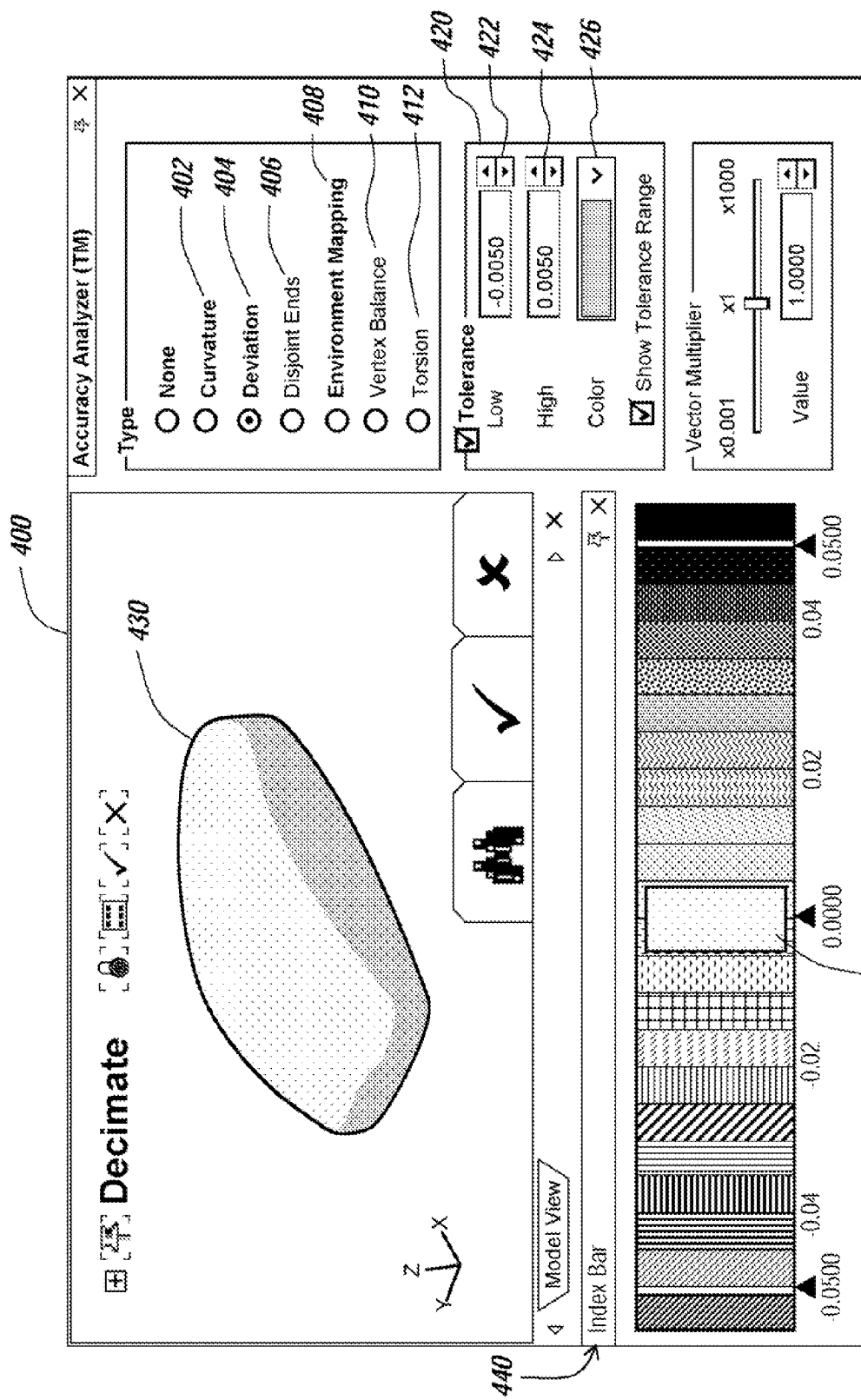
FIG. 4A depicts the setting of a deviation tolerance value.
Figure 4B:
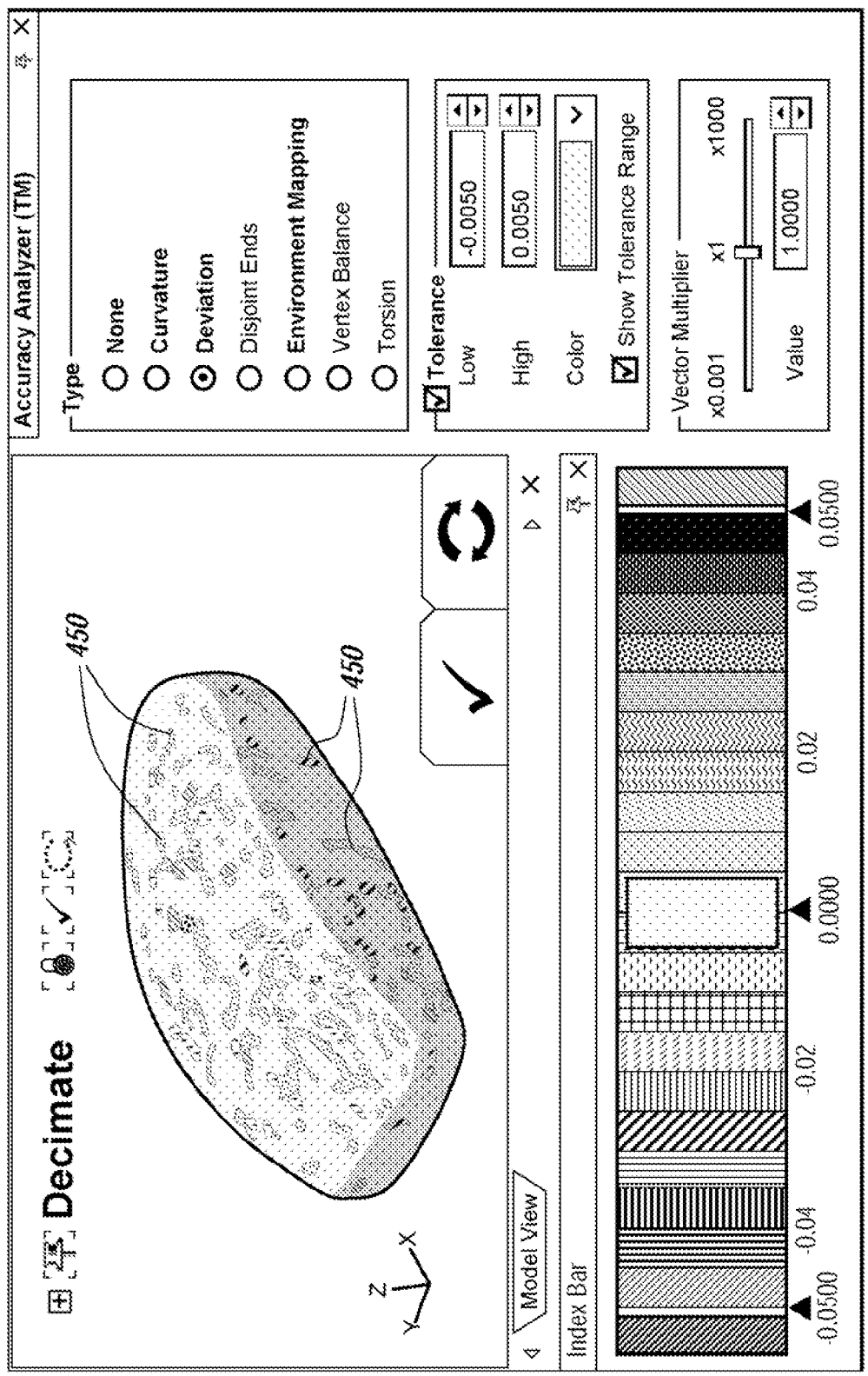
FIG. 4B depicts the application of a decimation operation with the areas outside of the tolerance setting displayed to a user.

FIGS. 4A-4B depict the use of the accuracy analyzer facility 5 of the present invention with a tolerance range. FIG. 4A depicts an exemplary user interface 400 that may be used to determine a measure of a loss of accuracy for a selected operation to be performed using 3D scan data. The user interface 400 may allow a user to select the type of accuracy loss being determined by the accuracy analyzer facility 5. For example, the user interface 400 may allow the user to request that the accuracy analyzer facility 5 track the amount of curvature 402, deviation, 404, disjoint ends 406, environment mapping 408, vertex balance 410 and torsion 412 attributable to a selected operation. In other words, the accuracy analyzer facility 5 determines the loss of accuracy for each type of accuracy metric that occurs/will occur between the starting scan data and the modified scan data. In FIG. 4A deviation 404 has been selected.

The graphical user interface 400 also includes a tolerance parameter 420 that may be selected and/or adjusted by the user that indicates how much a measurement can vary from a baseline reading before becoming a problem. The tolerance parameter may be expressed as a range with a low 422 and high 424 parameter. Measurements falling outside the indicated range may be expressed in their respective model regions through the display of an indicated color or pattern 426.

In FIG. 4A, before a decimation operation (the user-selected operation) has been performed, no vertices have been changed so the deviation (from the original) is zero everywhere. The tolerance is set at [−0.005, 0.005] and these tolerances show up on the depicted index bar 440 as dots on a white background 442. It will be appreciated that the index bar 440 could also user colors or another format instead of patterns. The graphical user interface 400 displays a model 430 that is completely dots on a white background because the deviation is universally zero (and therefore within tolerance).

The application of the scan data editing command (mesh editing command) 'decimate' affects the mesh and so the accuracy analyzer facility tracks the changes to the original/ starting scan data. As shown in FIG. 4B, the decimated mesh is now out of tolerance in some areas 450 that are depicted with different patterns. Although much of the model remains in the original dots on a white background, the blotches of other patterns show that there are some areas that are outside of tolerance. The areas outside of tolerance are mapped to the appropriate pattern shown on the index bar 440. These graphical changes act as an alarm to show that the scan data editing process has resulted in a deviation in some areas that are outside of the predefined tolerance of [−0.005, 0.005].

Figure 5:
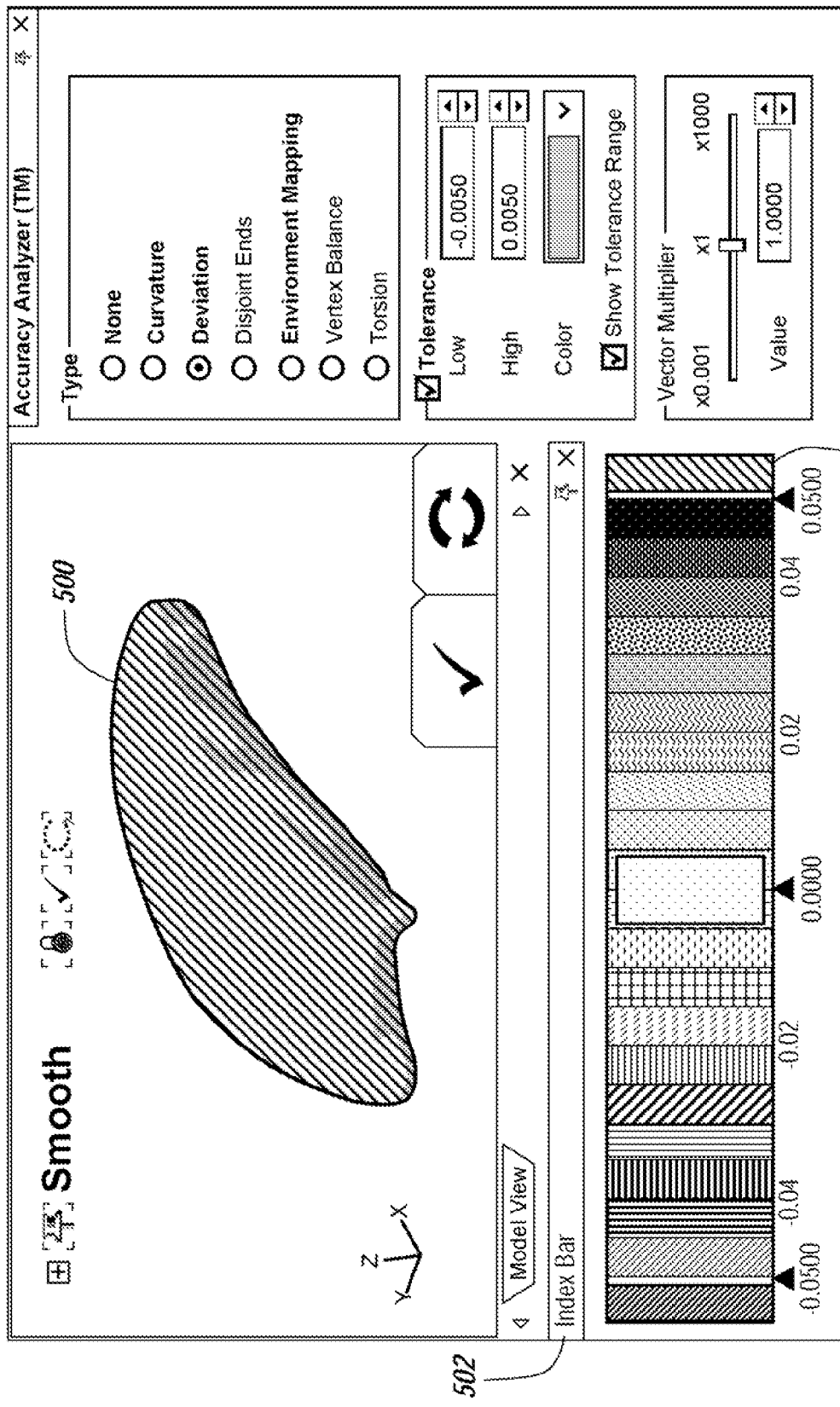
FIG. 5 depicts the displayed error results generated after applying an operation to a model that greatly exceeds a tolerance setting.

In one embodiment, the user is allowed to select an option to show the tolerance range. The showing of the tolerance changes the color mapping (or other type of indicator being used) of the deviation or other chosen type (incl. curvature, torsion, etc.) It does not affect the tolerance, only the method of display. The user also has the ability to change other tolerance settings and can choose to monitor other measures calculated from the scan data such as curvature, deviation, vertex balance, etc. as appropriate to a particular scan data editing stage. For example, FIG. 5 depicts a model 500 to which a user-selected smoothing function has been overapplied resulting in serious deformation. The effect of the smoothing operation is that all points of the model are now far out of tolerance and the model is therefore mapped to its respective pattern on the index bar 502, a dark diagonal line pattern 504. In alternate embodiments colors or other indicators may also be used instead of patterns to denote the area that is out of tolerance.

The accuracy analyzer facility 5 enables the display of a loss of accuracy attributable to user-selected (or programmatically selected) operations performed using 3D scan data.

The accuracy analyzer facility 5 shows the deviation (or other measure implied by the scan data such as curvature) for many types of scan data editing operations. Exemplary scan data editing operations include decimation, subdividing, smoothing, cleaning, remeshing, defeaturing, filling holes, smoothing boundary, etc.). An index map such as a color map is applied to the model to show the amount of determined deviation (or other measure). If a setting to show the tolerance range has been selected, then deviations (or another measure) within the pre-set tolerance range is given the tolerance color, pattern or other indicator. When the displayed model is not displayed so as to match the tolerance color, pattern or other indicator, the display acts as a visual alarm indicating that part of the model is outside of tolerance.

Subdividing breaks a single polygon into many polygons and is the opposite of decimation. Smoothing in its simplest form looks at a small region of a model (e.g.: in a mesh model, one triangle surrounded by three triangles for a total of four triangles) and averages the center triangle's position and size based on the surrounding triangles. Smoothing removes high frequency noise and high frequency waves in the mesh. Cleaning refers to errors in the mesh. Errors include edges which do not match up, crossing polygon faces, or edges which are not one to one. Cleaning is an automatic process. Hole filling recognizes boundary polygon edges and fills the hole flat across the hole or based on curvature or based on a combination of curvature and fiat hole filling. Remeshing reorganizes the vertices of the polygon to make the triangles balanced in shape (isosceles) and size. Defeaturing removes logos or other features inscribed on a scanned plate from the polygon data automatically. The accuracy analyzer facility may also use determined out of tolerance information to notify the user that a mesh is out of tolerance. The notification may be made via a dialog box, pop-up menu, list, or other means.

The user and/or the accuracy analyzer facility 5 may use the deviation information determined by the accuracy analyzer facility to adjust the scan data editing controls and parameters so as to minimize the accuracy loss attributable to performing the desired scan data editing functions. These parameter adjustments could be automatic or manually chosen. For example, software may automatically adjust the decimation parameters to maximize decimation effects (smaller data size) while maintaining tolerance over the whole model (whole model deviation or regionally) such that the deviation does not exceed tolerance.

In one example of adjusting scan data editing parameters, a user might desire a target polygon count that is fairly small. X level smoothing may be applied to remove high frequency noise. A Y level of decimation may be applied to lower the polygon count. The user may want to maintain accuracy of level ZZ (a fraction (i.e.: 100%) within tolerance). The user may define a variable DATA VALUE to be a function of both X & Y. The user may desire the fewest amount of polygons while increasing the amount of smoothing. The user would therefore try to maximize DATA VALUE by adjusting X & Y with the tolerance constraint ZZ. A simpler version of this example may be seen with the use of only 1 operation, i.e.: smoothing. DATA VALUE becomes X, so the user would attempt to perform as many smoothing operations as possible while staying within the tolerance constraint ZZ.

As noted above, there are other types of accuracy measurements besides deviation that may be determined by the accuracy analyzer facility 5. Exemplary additional types of accuracy measurements that may be determined by the accuracy analyzer facility 5 include curvature, environment mapping, vertex balance and torsion.

Curvature is calculable for meshes/surfaces and curves. For meshes/surfaces, it is essentially the second discrete space derivative of the mesh or the second continuous space derivative of a surface. For curves it is the second continuous curve derivative of the curve. The distinction between discreet and continuous is that curves (interpolated/spline) and surfaces are mathematical representations. Meshes have no mathematical representation except that each polygon is a triangle and flat. The mathematical representation of surfaces means that the accuracy analyzer facility 5 can evaluate continuous first, second, etc. derivatives of the mesh. These are continuous as opposed to discrete. In order to determine the curvature of a mesh, the accuracy analyzer facility 5 samples a few polygons. The sample is then translated into a curvature measure which is representative of the local mesh area.

In one embodiment a user interface for curvature is nearly identical to the user interface discussed above when determining the amount of deviation caused by a selected operation. The user may set tolerances on allowable curvature, and the color map (or other type of indicator/error map) would be applied depending on the curvature tolerance settings. Curvature may be shown on a model. Tolerance parameters similar to those discussed for deviation may be selected and affect the color or other type of indicator displayed on the model.

Figure 6:
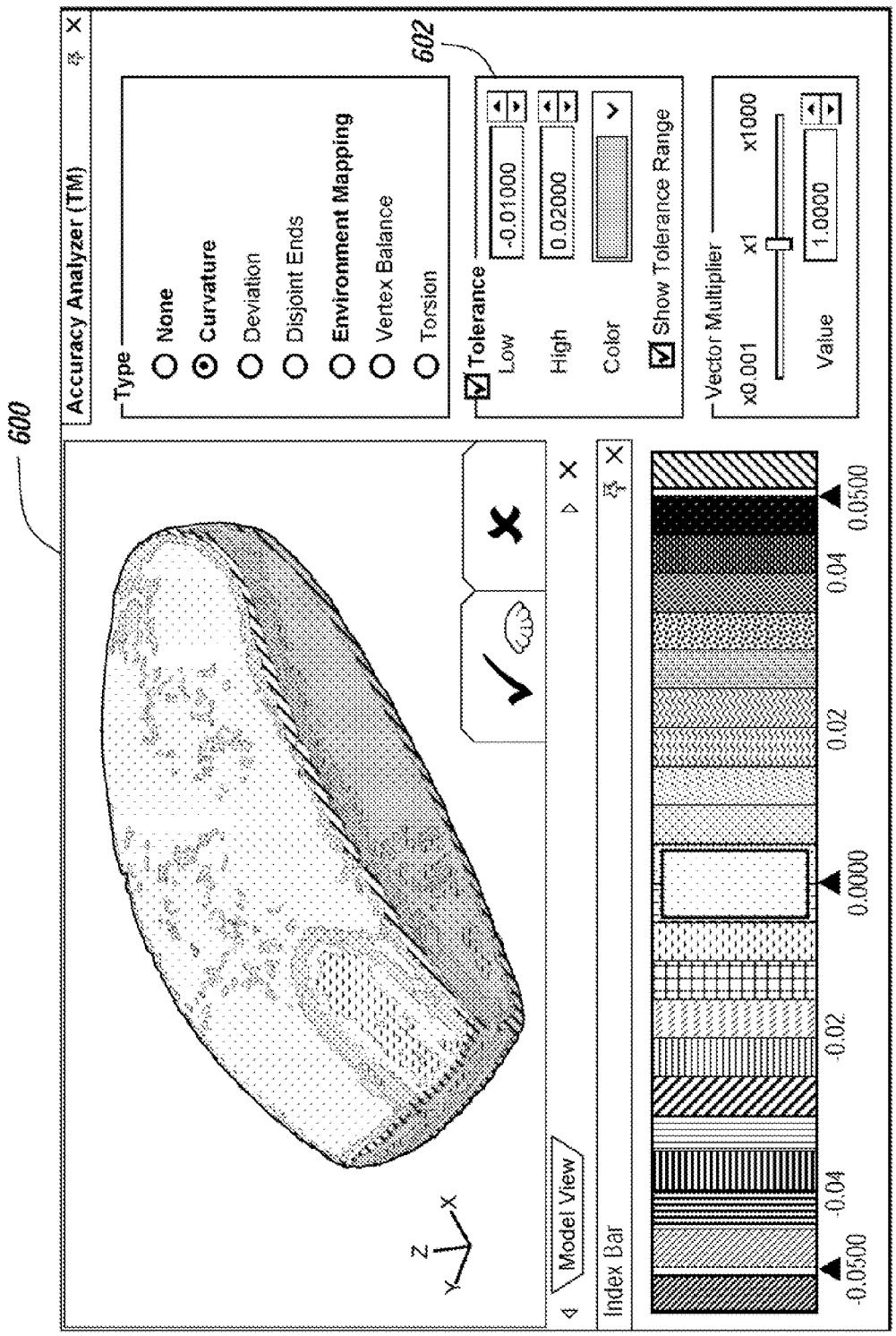
FIG. 6 depicts a user interface for the present invention used to track the accuracy of curvature.
Figure 7A:
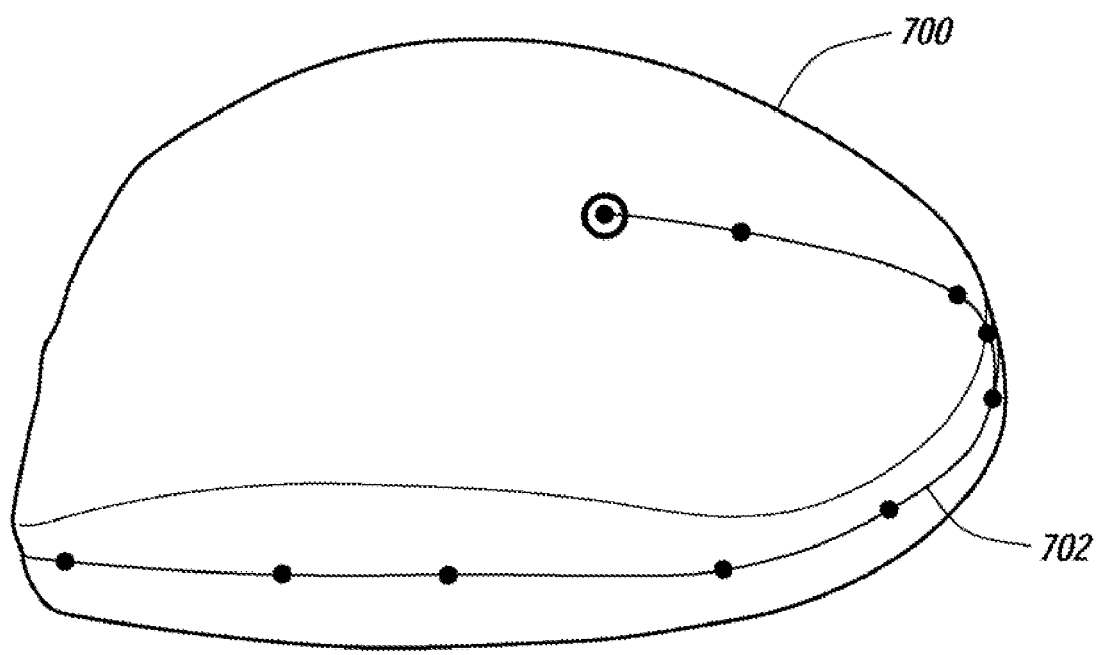
FIGS. 7A and 7B depict the display of accuracy information for curvature with a tolerance setting for a curve drawn on a mesh.
Figure 7B:
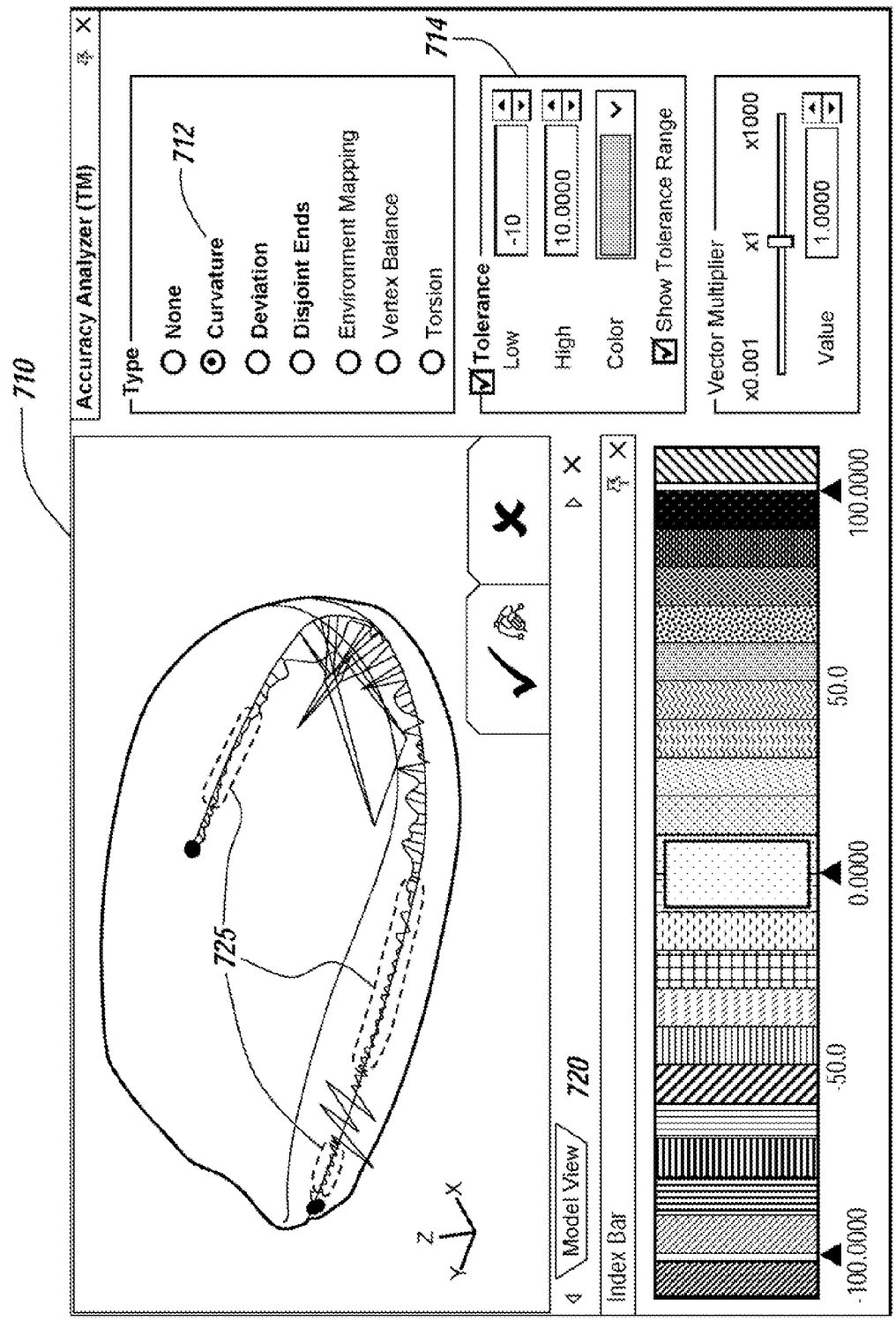

FIG. 6 depicts an exemplary user interface 600 generated by the accuracy analyzer facility 5 that enables a user to track curvature accuracy by selecting a tolerance range 602. FIGS. 7A and 7B depict curvature applied to curves. FIG. 7A depicts a curve 702 drawn on a mesh 700. FIG. 7B shows that curvature 712 has been selected by a user in the user interface 710 along with some tolerance settings 714. The model view 720 reflects where the curvature is within the tolerance of [−10, 10.0000] (circled areas 725). It will be appreciated that the areas that are determined to be within the specified tolerance range may also be denoted using color.

Figure 8:
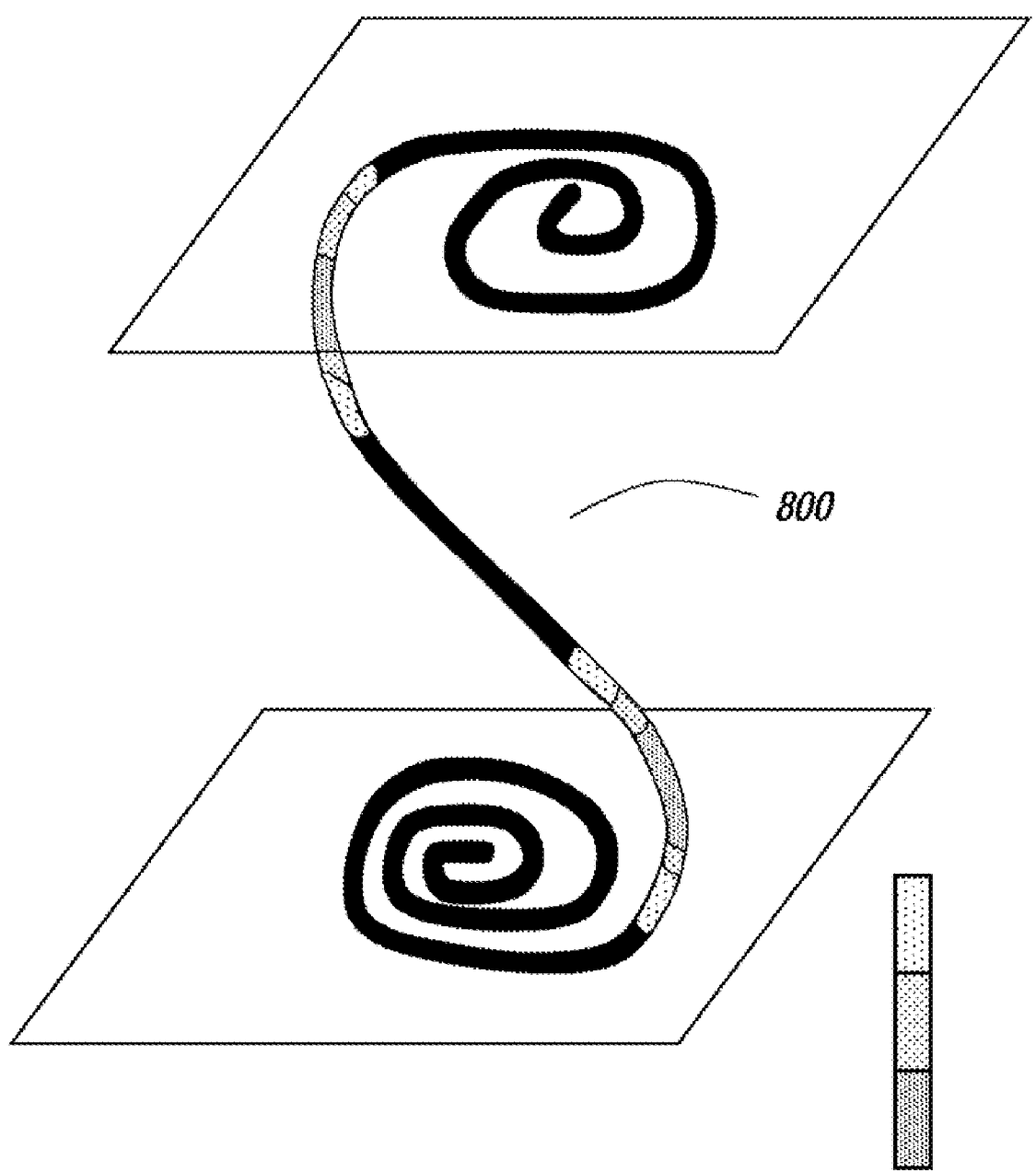
FIG. 8 depicts a space curve with a torsion color map.

A user can also use the accuracy analyzer facility 5 to set tolerances for torsion on curves. Torsion is a mathematical characteristic of a curve and quantifies how much the curve's "direction" of rotation is changing at locations about the curve. Torsion may be defined as "The rate of change of the osculating plane of a space curve. The torsion $\tau$ is positive for aright-handed curve, and negative for a left-handed curve. A curve with $\kappa< >0$ curvature is planar if $\tau=0$" (From Mathworld, http://mathworld.wolfram.com/Torsion.html). A helix has a lot of torsion because it is never on a single plane. FIG. 8 depicts a space curve with a torsion pattern map 800. Tolerance parameters for torsion applied to curves behave the same as curvature applied to curves. Similar to deviation calculations of a spline or interpolated curve, the curvature and torsion calculations on a spline or interpolated curve are calculated by breaking the curve up into many parts and calculating the curvature or torsion in the smaller part. The more the curve is broken up, the more curvature and torsion calculations are required.

Figure 9:
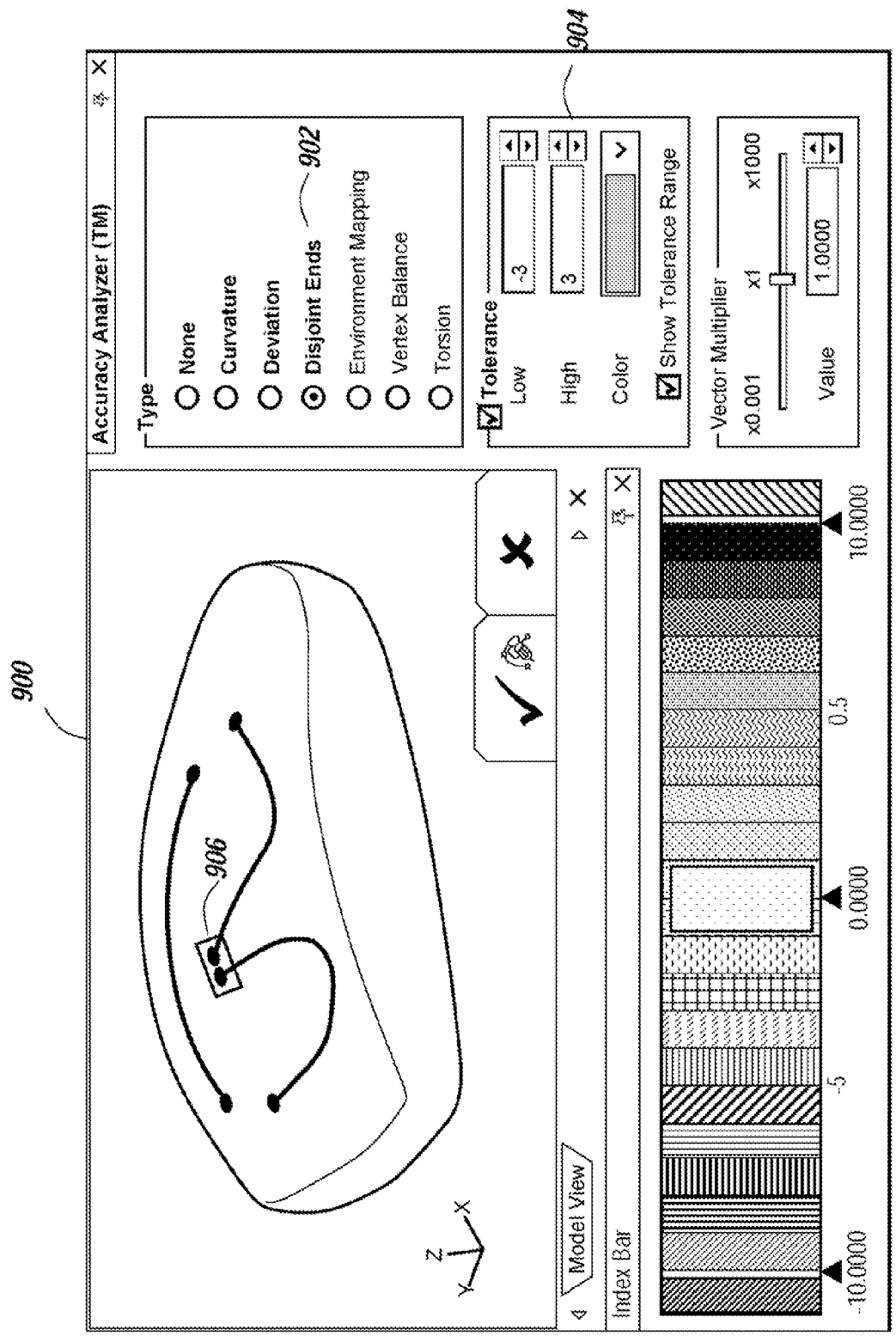
FIG. 9 depicts a user interface used to track the accuracy of disjoint ends.

In another embodiment, the accuracy analyzer facility 5 may also be used to identify disjoint ends of curves. If curves do not meet, they are disjoint. FIG. 9 depicts the use of the accuracy analyzer facility to identify disjoint curve ends. A graphical user interface 900 is provided in which the user has selected a "disjoint ends" command 902 and provided an acceptable tolerance 904. The accuracy analyzer facility 5 determines and identifies the curve end points which fall within tolerance 906. This function may be of particular use if there are many curves and the endpoints are very close together (but still disjoint).

The accuracy analyzer facility 5 may also be used to measure continuity in a CAD model. Continuity measures the position or tangent vector deviation between neighboring boundary edges of adjacent surfaces. A user can choose a position (G0 continuity) and/or tangency (G1 continuity) method from a provided user interlace.

Figure 10:
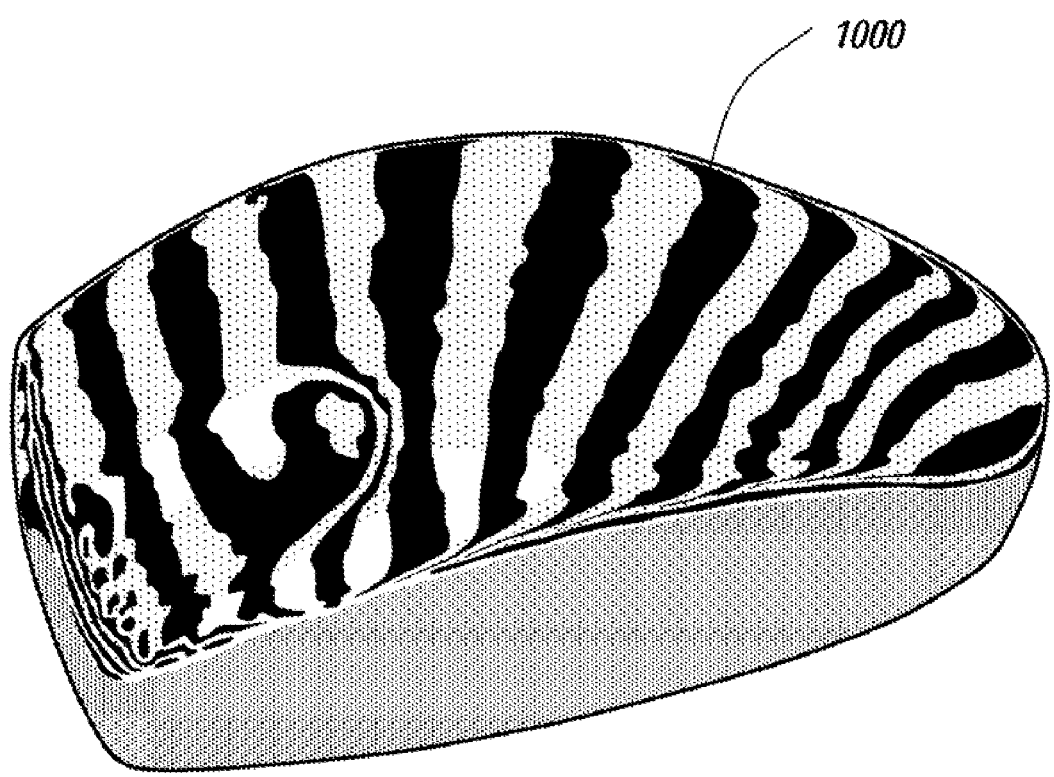
FIG. 10 depicts an environment mapping performed by the accuracy analyzer facility.

FIG. 10 depicts the use of the accuracy analyzer facility 5 to perform environment mapping. Environment mapping puts a surface into a virtual environment (such as a room with stripes) and looks at the reflection of the room off of the surfaces 1000. Because the surfaces are continuous and mathematical represented, the reflection of the lines is continuous though not always very smooth. Tolerance settings aren't applicable in environment mapping. Areas where the stripes are not smooth indicate a lack of accuracy. Environment Mapping is applicable after surfaces have been created, and therefore would be most applicable in the CAD/surface redesigning stage of accuracy analysis.

As noted above, the accuracy analysis facility 5 can determine deviation on a mesh or other type of model such as a point cloud model. This operation compares the distance from one model to another model (created as a result of a selected operation) about the entire model to identify the deviation. Furthermore, the present invention can calculate the deviation caused by subsequent operations or between a model's current state and the designated "original" or "reference" model.

graphical preview command which allows the user to preview the result of the command. When previewing the result, the user also can preview accuracy loss which is illustrated by error maps and users can adjust parameters to minimize the accuracy loss. The parameters may also be adjusted programmatically without user intervention. Accuracy loss in CAD remodeling operations is the distance deviation between the original 3D scan data and reverse engineered CAD part.

Figure 11A:
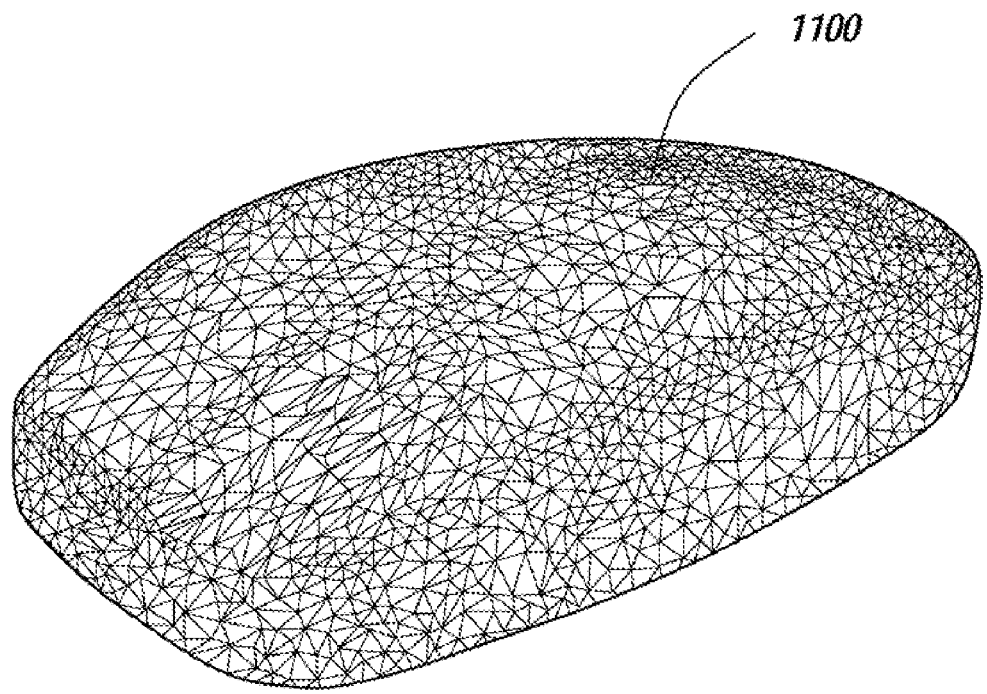
FIGS. 11A-11C depict the tracking of accuracy for a CAD remodeling command (autosurfacing)
Figure 11B:
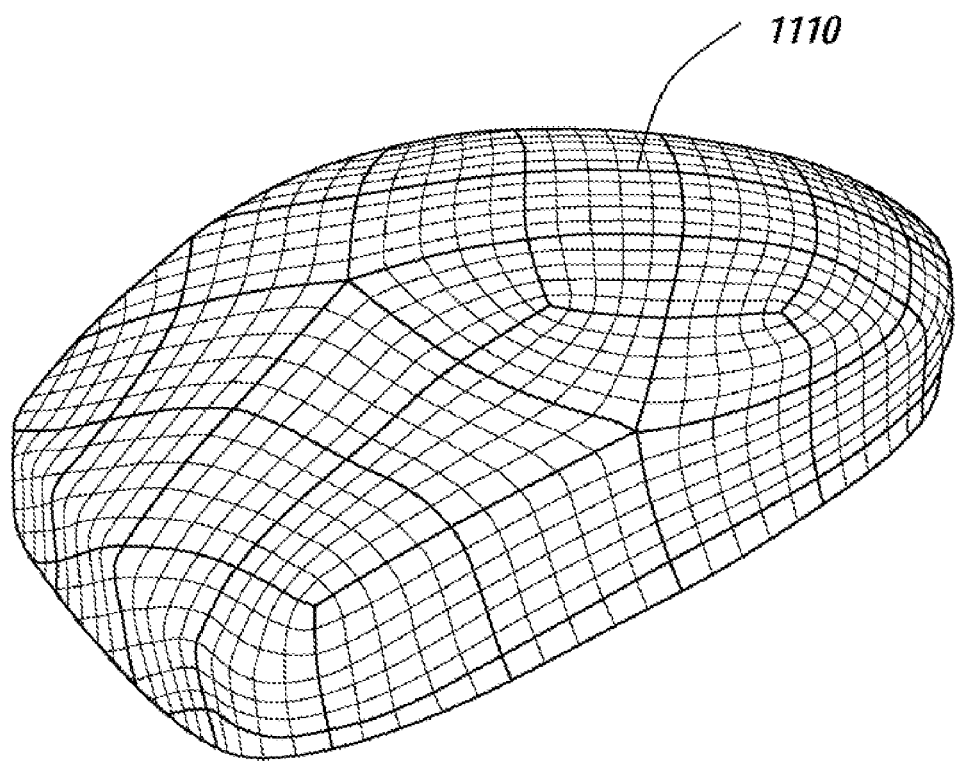
Figure 11C:
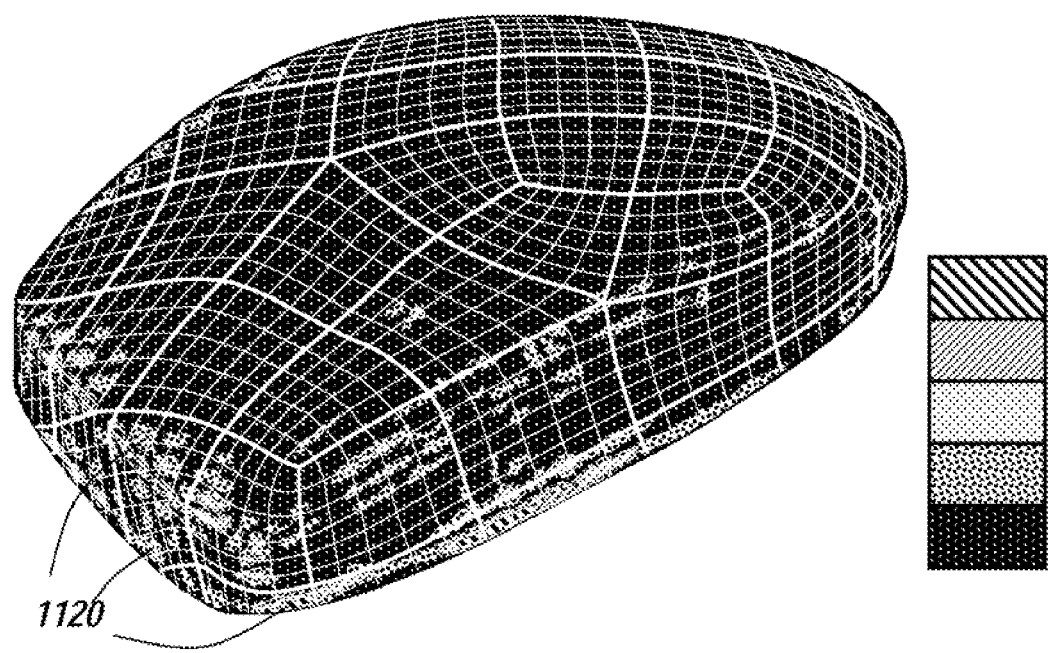

FIGS. 11A-11C demonstrate the use of the accuracy analyzer facility 5 with CAD remodeling operations. When performing an Autosurfacing command, surfaces are fit around the entire model. FIG. 11A shows a starting model 1100 and FIG. 11B show the model 1110 after the execution of the Autosurfacing command. The Autosurfacing command automatically creates surfaces that are fit to the model by minimizing surface/model error. The surfaces have position match and tangency match. FIG. 11C shows a display generated by the accuracy analyzer facility 5 that identifies the areas of deviation 1120 between the surface and the starting model that exceed an indicated tolerance. The tolerance pattern in the depicted example is white dots on a black background. The other patterns indicate that the surface deviation has exceeded the user-chosen tolerance (i.e.: [−0.005, 0.005]) for those patterned areas. Deviation attributable to CAD remodeling operations may be calculated by the accuracy analyzer

| Model State 1 | hole fill → | Model State 2 | Smoothing → | Model State 3 | Decimate → | Model State 4 |
|---|---|---|---|---|---|---|
| (raw) | | (hole fill) | | (hole fill) (smoothed) | | (hole fill) (smoothed) (decimated) |
| reference | | | | | | current |

After performing the decimation command and generating/previewing the current state (Model State 4), a user may use the accuracy analyzer facility 5 to analyze the deviation between the current state of the model and the last/previous state of the model (Model State 3) OR the "reference" state (Model State 1).

The accuracy analyzer facility 5 may also provide a graphical user interface that allows a user to change the designation of the reference state. The user could assign Model State 2 to be the reference state. Such an assignment would place Model State 2 data in memory so that deviations can be calculated.

facility 5 using various methods. Similarly to the techniques described above for the scan data editing techniques, in one method, from the reference model, per polygon, the accuracy analyzer facility 5 may find the closest Polygon Center, Edge or Vertex of the other model. This is the determined deviation value. In another method, the deviation may be calculated per polygon by determining the normal direction of the polygon. The accuracy analyzer facility then searches in this direction for the nearest polygon in the other model. This is the determined deviation value.

| Model State 1 | hole fill → | Model State 2 | Smoothing → | Model State 3 | Decimate → | Model State 4 |
|---|---|---|---|---|---|---|
| (raw) | | (hole fill) | | (hole fill) (smoothed) | | (hole fill) (smoothed) (decimated) |
| | | reference | | | | current |

In the current state, the user may now analyze deviations between the last/previous state (Model State 3) OR the reference state (Model State 2).

Figure 12A:
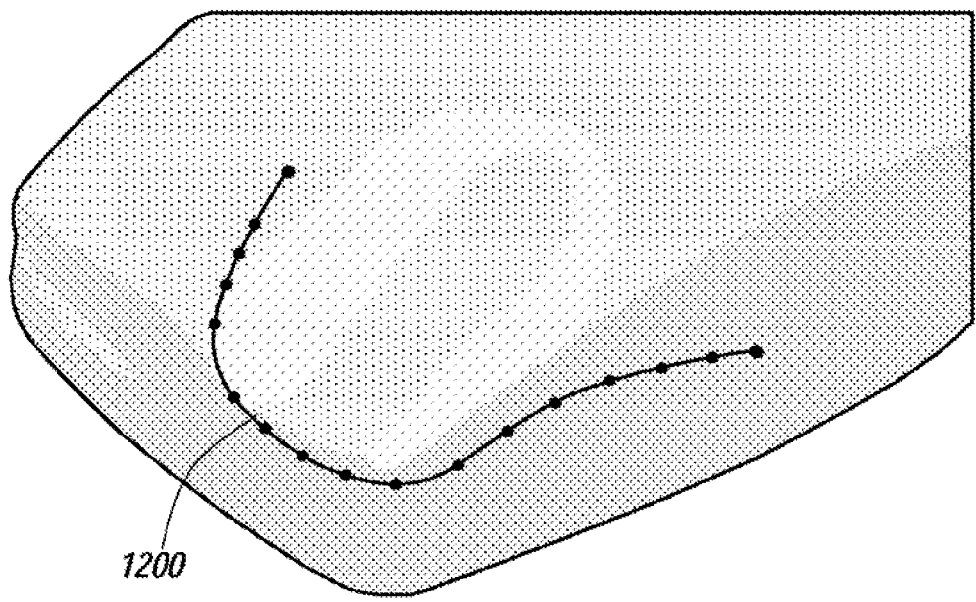
FIGS. 12A and 12B depict the display of deviation values for a curve drawn on scan data.
Figure 12B:
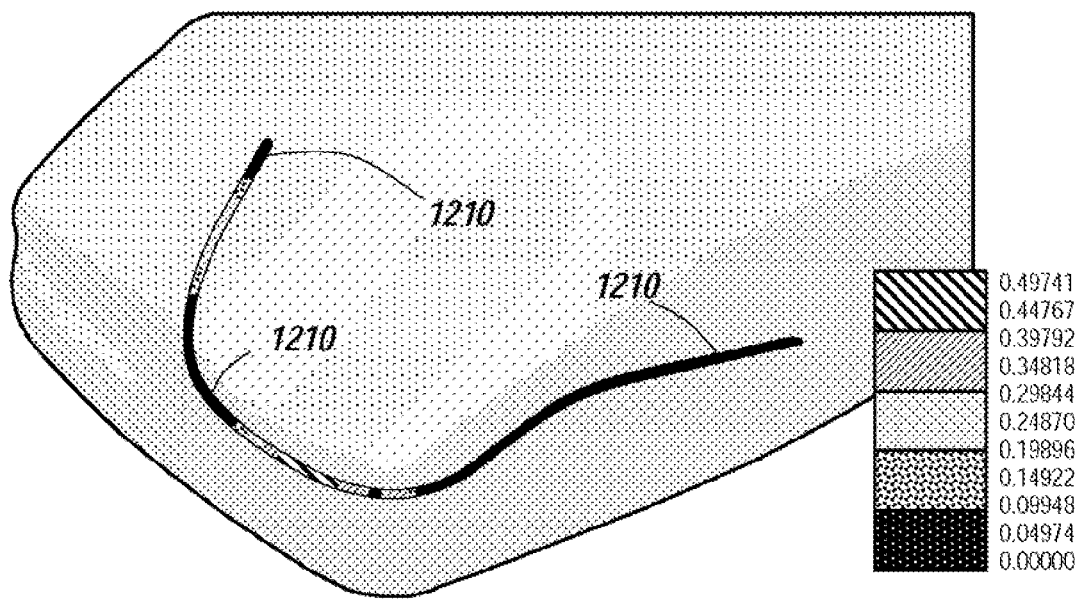

An embodiment of the present invention may also be used to track accuracy loss caused by the performance of CAD remodeling operations. When the user runs any CAD modeling commands, the accuracy analyzer facility 5 is available. In one embodiment, the command dialog window provides a Another common operation in CAD remodeling is placing/drawing curves on the scan data. The present invention can monitor the deviation of the curve from the original scan data in a similar way. An interpolated curve 1200 is shown in FIG. 12A. It is also known as a spline. Splines are inherently smooth, and only require control points (and end conditions) to create. Eight (8) input points are needed to create the depicted curve 1200. The drawn curve deviates from the scan data and this deviation is identified as mapped by the pattern bar shown in FIG. 12B. If a tolerance range was prescribed (i.e.: [−0.01, 0.01]) and the toggle "show tolerance range" was turned on then a user could expect some of this curve to be within tolerance 1210 and therefore patterned appropriately (white dots on a black background).

Curve deviation is a local measure along the curve. The curve is broken up into many small parts and the deviation is calculated. The operation results in far more broken up parts than the original 8 interpolation points of the curve. There are thus many deviation analysis points. Curve deviation is calculated by the closest distance between the curve (part of the curve which the deviation is being calculated) and the mesh/point cloud model.

Figure 14C:
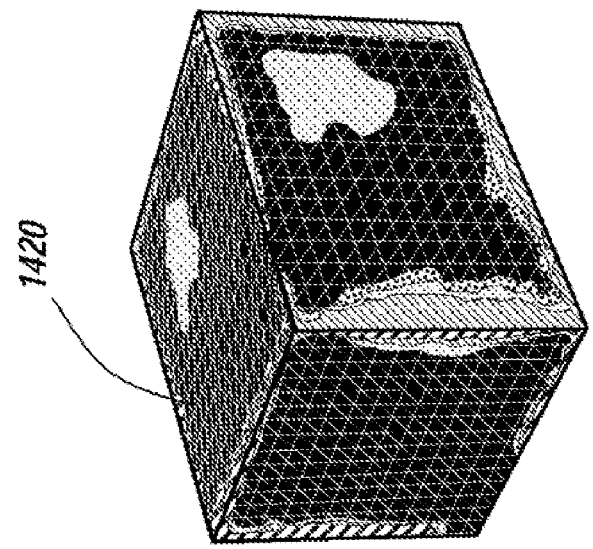
FIGS. 14A-14C depicts the sequence of FIGS. 13A-13C adjusted with the use of an optimization routine.
Figure 14B:
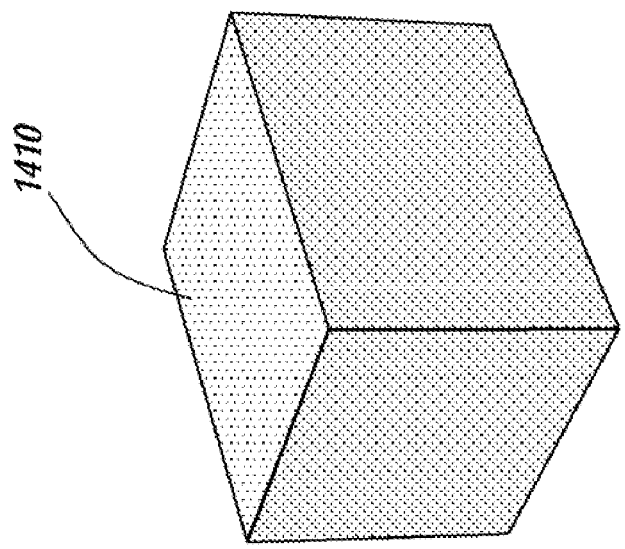
Figure 14A:
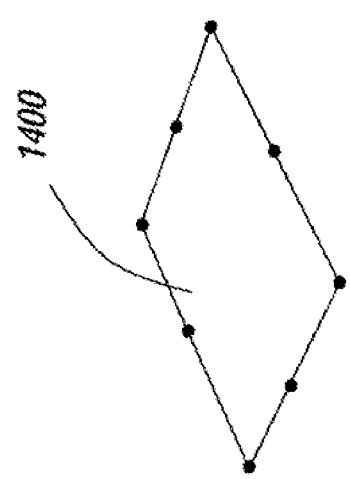

FIGS. 13A-13C show the use of the accuracy analyzer facility with a CAD part while FIGS. 14A-14C show the process of adjusting CAD parameters to minimize accuracy loss. The deviation of the CAD solid model from the original/starting scan data is frequently quite large. FIG. 13A depicts the original/starting scan data 1300 while FIG. 13B shows the solid model 1310 that is generated based on the scan data. FIG. 13C shows a displayed error map 1320 that may be generated by the accuracy analyzer facility 5 of the present invention to show the deviation between the original scan data 1300 and the solid model 1310.

The accuracy analyzer facility 5 may run an optimization routine, such as an error-minimization routine, to adjust the parameters of the CAD solid 1310 (for example the height, width and position of the sketch profile 1400 for the extrusion as shown in FIG. 14A). The dimensions are adjusted in order to minimize the total error and adopt the best parameters for the CAD model. The optimization routine results in anew solid model 1410 (FIG. 11B) for which the whole deviation is decreased 1420, as shown in FIG. 14C.

Running a computation intensive error-minimization routine may be based on visual indication provided by the accuracy analyzer facility 5 or other indicator that the current data is out of tolerance. The accuracy analyzer facility 5 may show the effect of the error-minimization routine. The error-minimization routine may be performed within the software or performed manually to adjust the parameters to minimize the accuracy loss. Adjustment of the dimensions in order to minimize the whole deviation is one of a number of options. For example, the user could choose to adjust the CAD parameters to minimize the error over a chosen region or regions instead of the entire model.

Similar to the scan data editing techniques discussed above where the user tries to maximize a variable CAD VALUE by modifying X & Y while staying within the constraint of ZZ, the user can perform a similar maximization of accuracy (or minimization of error) for CAD remodeling operations by adjusting parameters of the model. In one exemplary embodiment:

1) The user creates an extrusion using a base sketch. The user calls the dimensions of a rectangle X & Y, and the extrusion distance Z: X, Y & Z are the width, depth and height of the rectangular box. These are the parameters of the model.
2) The user inherently enforces the sketch lines to be perpendicular to each other, other constraints could be added.
3) The user may desire to minimize the error (minimize the deviation) over the whole model. Alternately, the user may choose to minimize the error over regions of the model instead. Error Minimization is similar to CAD VALUE.
4) The user may adjust parameters X, Y, Z using a multivariate optimization process to minimize the deviation (or maximize the CAD VALUE).
5) A multi variable optimization is seen in many numerical settings.
   a. Fitting a straight line to data:
      i. Line equation: y=m*x+b, where b and m are variables, and y and x are the user's 2 data sets.
      ii. The user may choose a starting m & b. Error is the difference (or "squared" distance; sum of the distances squared) between the data set's y and the calculated y using the starting m&b and x.
      iii. The user adjusts m & b until the error is minimized.
      iv. This is Least Squares Minimization of Error, or multivariable optimization.

The techniques used by the accuracy analyzer facility 5 to perform CAD remodeling operations (deviation of surfaces and curves) are similar in concept to the scan data editing examples (deviation before and after scan data editing functions) discussed above.

The present invention may be provided as one or more computer-readable programs embodied on or in one or more mediums. The mediums may be a floppy disk, a hard disk, a compact disc, a digital versatile disc, a flash memory card, a PROM, a RAM, a ROM, or a magnetic tape. In general, the computer-readable programs may be implemented in any programming language. Some examples of languages that can be used include FORTRAN, C, C++, C#, or JAVA. The software programs may be stored on or in one or more mediums as object code. Hardware acceleration may be used and all or a portion of the code may run on a FPGA or an ASIC. The code may run in a virtualized environment such as in a virtual machine. Multiple virtual machines running the code may be resident on a single processor.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A computer-readable non-transitory storage medium holding computer-executable instructions for analyzing 3D modeling accuracy when processing 3D scan data, the instructions when executed causing at least one computing device to:
   provide a collection of 3D scan data forming a model representing the shape of a three dimensional object;
   provide a CAD system being used to remodel at least one CAD part body formed from the 3D scan data;
   receive a selection of an operation designed to manipulate one of at least a portion of the 3D scan data or at least a portion of the at least one CAD part body;
   determine a measure of loss of accuracy attributable to the selected operation; and
   present the measure of the loss of accuracy to a user.

2. The medium of claim 1 wherein the model is a mesh model.

3. The medium of claim 1 wherein the model is a point cloud model.

4. The medium of claim 1 wherein the instructions when executed further cause the at least one computing device to:
present the measure of the loss of accuracy as a preview to a user prior to beginning the operation.

5. The medium of claim 1, wherein the instructions when executed further cause the at least one computing device to:
present the measure of the loss of accuracy to a user after the completion of the operation.

6. The medium of claim 1 wherein the measure of the loss of accuracy is presented to the user graphically.

7. The medium of claim 6 wherein the measure of the loss of accuracy is presented to the user via an error map.

8. The medium of claim 7 wherein the error map is a heat map.

9. The medium of claim 1 wherein the determining of the loss of accuracy includes comparing an effect of the selected operation against a user-selected tolerance.

10. The medium of claim 9 wherein the user-selected tolerance is expressed as a range.

11. The medium of claim 1 wherein the operation is a scan data editing operation.

12. The medium of claim 11 wherein the operation is a meshing operation.

13. The medium of claim 12 wherein the meshing operation is one of smoothing, decimation, subdividing, cleaning, re-meshing, de-featuring, filling holes and the smoothing of a boundary.

14. The medium of claim 11 wherein the measure of the loss of accuracy measures the loss of accuracy of at least one of curvature, deviation and vertex balance occurring in the scan data as result of the performance of the selected operation.

15. The medium of claim 11 wherein the instructions when executed further cause the at least one computing device to:
adjust at least one parameter of the selected operation as a result of the determining of the measure of loss of accuracy.

16. The medium of claim 15 wherein the adjusting occurs programmatically without user involvement.

17. The medium of claim 1 wherein the operation is a CAD remodeling operation.

18. The medium of claim 17 wherein the CAD remodeling operation is one of fitting a surface to the scan data, placing or drawing curves on the scan data, creating a solid body using the scan data, measuring curvature, measuring deviation, measuring continuity and environment mapping.

19. The medium of claim 17, wherein the instructions when executed further cause the at least one computing device to:
perform an optimization routine so as to adjust at least one parameter of a CAD part body as a result of the determining of the measure of loss of accuracy.

20. The medium of claim 19 wherein the optimization routine is an error minimization routine.

21. The medium of claim 20, wherein the instructions when executed further cause the at least one computing device to:
adjust a CAD part body parameter so as to minimize an amount of error over at least one chosen region.

22. The medium of claim 21 wherein the adjusting occurs programmatically without user involvement.

23. The medium of claim 1, wherein the instructions when executed further cause the at least one computing device to:
update programmatically a measure of the loss of accuracy, the updating occurring when a change in one of the 3D scan data and the at least one CAD part body is attributable to the user selection of the operation.

24. A method for analyzing 3D modeling accuracy when processing 3D scan data, comprising:
providing a collection of 3D scan data forming a model representing the shape of a three dimensional object;
providing a CAD system being used to remodel at least one CAD part body formed from the 3D scan data;
receiving a selection of an operation designed to manipulate one of at least a portion of the 3D scan data or at least a portion of the at least one CAD part body;
determining a measure of loss of accuracy attributable to the selected operation; and
presenting the measure of the loss of accuracy to a user.

25. The method of claim 24, further comprising:
presenting the measure of the loss of accuracy as a preview to a user prior to beginning the operation.

26. The method of claim 24, further comprising:
presenting the measure of the loss of accuracy to a user after the completion of the operation.

27. The method of claim 24 wherein the operation is a scan data editing operation.

28. The method of claim 27 wherein the operation is one of smoothing, decimation, subdividing, cleaning, re-meshing, de-featuring, filling holes and the smoothing of a boundary.

29. The method of claim 24 wherein the measure of the loss of accuracy is presented to the user graphically.

30. The method of claim 29 wherein the measure of the loss of accuracy is presented to the user via an error map.

31. The method of claim 24 wherein the determining of the loss of accuracy includes comparing an effect of the selected operation against a user-selected tolerance value.

32. The method of claim 24 wherein the measure of the loss of accuracy measures the loss of accuracy of at least one of curvature, deviation and vertex balance occurring in the scan data as result of the performance of the selected operation.

33. The method of claim 24, further comprising:
adjusting at least one parameter of the selected operation as a result of the determining of the measure of loss of accuracy.

34. The method of claim 24 wherein the operation is a CAD remodeling operation.

35. The method of claim 34 wherein the CAD remodeling operation is one of fitting a surface to the scan data, placing or drawing curves on the scan data and creating a solid using the scan data, measuring curvature, measuring deviation, measuring continuity and environment mapping.

36. The method of claim 35, further comprising:
performing an optimization routine so as to adjust at least one parameter of a CAD part body as a result of the determining of the measure of loss of accuracy.

37. The method of claim 36 wherein the optimization routine is an error minimization routine.

38. The method of claim 37, further comprising:
adjusting the parameters of the error minimization routine so as to minimize an amount of error over at least one chosen region.

39. The method of claim 24, further comprising:
updating programmatically a measure of the loss of accuracy, the updating occurring when a change in one of the 3D scan data and the at least one CAD part body is attributable to the user selection of the operation.

40. A system for analyzing 3D modeling accuracy when processing 3D scan data, comprising:
a collection of 3D scan data forming a model representing the shape of a three dimensional object;
a CAD application being used to remodel at least one CAD part body formed from the 3D scan data;

a user interface enabling the selection of an operation, the operation being one of a scan data editing operation and CAD remodeling operation; and an accuracy analysis facility, the accuracy analysis facility measuring a loss of accuracy attributable to the selected operation, the measured loss of accuracy presented to a user.

41. The system of claim 40 wherein the user interface presents a measure of the loss of accuracy to a user via a generated error map.

42. The system of claim 40 wherein the measure of accuracy displayed to the user via the generated error map is programmatically updated when the user selection of an operation results in a change to the 3D scan data or the at least one CAD part body.

43. The system of claim 40 wherein the user interface presents an indication of a measure of the loss of accuracy to a user and the indication of a measure of the loss of accuracy is programmatically updated when the user selection of an operation results in a change to the 3D scan data or the at least one CAD part body.

* * * * *